(12) United States Patent
Wu

(10) Patent No.: US 10,009,028 B2
(45) Date of Patent: Jun. 26, 2018

(54) FREQUENCY AND MATCH TUNING IN ONE STATE AND FREQUENCY TUNING IN THE OTHER STATE

(71) Applicant: Lam Research Corporation, Fremont, CA (US)

(72) Inventor: Ying Wu, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 0 days. days.

(21) Appl. No.: 15/683,568

(22) Filed: Aug. 22, 2017

(65) Prior Publication Data

US 2018/0097520 A1    Apr. 5, 2018

Related U.S. Application Data

(60) Provisional application No. 62/402,608, filed on Sep. 30, 2016.

(51) Int. Cl.
| | |
|---|---|
| *H03K 19/01* | (2006.01) |
| *H03K 19/003* | (2006.01) |
| *H04B 1/10* | (2006.01) |
| *H04B 1/7136* | (2011.01) |
| *H01L 21/02* | (2006.01) |

(52) U.S. Cl.
CPC .. *H03K 19/00384* (2013.01); *H01L 21/02252* (2013.01); *H01L 21/02274* (2013.01); *H03K 19/00361* (2013.01); *H04B 1/7136* (2013.01); *H04B 2001/1072* (2013.01)

(58) Field of Classification Search
None
See application file for complete search history.

(56) References Cited

U.S. PATENT DOCUMENTS

| | | | |
|---|---|---|---|
| 6,225,745 B1 | 5/2001 | Srivastava | |
| 6,656,848 B1 | 12/2003 | Scanlan et al. | |
| 7,095,178 B2 | 8/2006 | Nakano et al. | |
| 7,435,926 B2 | 10/2008 | Jafarian-Tehrani | |
| 7,489,718 B2 | 2/2009 | Hill | |
| 8,048,806 B2 | 11/2011 | Kutney et al. | |
| 8,620,236 B2 | 12/2013 | Manssen et al. | |
| 9,082,589 B2 | 7/2015 | Thomas et al. | |
| 9,155,182 B2 | 10/2015 | Valcore, Jr. et al. | |
| 9,171,699 B2 | 10/2015 | Valcore, Jr. et al. | |
| 9,320,127 B2 | 4/2016 | Valcore, Jr. et al. | |
| 9,544,987 B2 | 1/2017 | Mueller et al. | |
| 9,627,182 B2 | 4/2017 | Valcore, Jr. et al. | |
| 2008/0063810 A1 | 3/2008 | Park et al. | |
| 2014/0367043 A1 | 12/2014 | Bishara et al. | |
| 2015/0244048 A1 | 8/2015 | Poust et al. | |
| 2015/0313000 A1 | 10/2015 | Thomas et al. | |
| 2016/0259872 A1 | 9/2016 | Howald et al. | |

*Primary Examiner* — Crystal L Hammond
(74) *Attorney, Agent, or Firm* — Martine Penilla Group, LLP

(57) ABSTRACT

Systems and methods for frequency and match tuning in one state S1 and frequency tuning in another state S2 are described. The systems and methods include determining one or more variables for the states S1 and S2, and tuning a frequency for the state S1 of a radio frequency (RF) generator based on the one or more variables.

24 Claims, 7 Drawing Sheets

Fixed frequency in S1, power differential changes

Fixed power differential, frequency in S1 is varied

FREQUENCY AND MATCH TUNING IN ONE STATE AND FREQUENCY TUNING IN THE OTHER STATE

CLAIM OF PRIORITY

The present patent application claims the benefit of and priority, under 35 U.S.C. § 119(e), to U.S. provisional patent application No. 62/402,608, filed on Sep. 30, 2016, and titled "Frequency and Match Tuning in One State and Frequency Tuning in the Other State", which is incorporated by reference herein in its entirety.

FIELD

The present embodiments relate to frequency and match tuning in one state and frequency tuning in the other state.

BACKGROUND

In some plasma processing systems, a radio frequency (RF) signal is provided to an electrode within a plasma chamber. The RF signal is used generate plasma within the plasma chamber. The plasma is used for a variety of operations, e.g., clean substrate placed on a lower electrode, etch a substrate, etc. During processing of the substrate using the plasma, the RF signal transitions between two states.

It is in this context that embodiments described in the present disclosure arise.

SUMMARY

Embodiments of the disclosure provide systems, apparatus, methods and computer programs for frequency and match tuning in one state and frequency tuning in the other state. It should be appreciated that the present embodiments can be implemented in numerous ways, e.g., a process, an apparatus, a system, a device, or a method on a computer readable medium. Several embodiments are described below.

In multi-state pulsing where an impedance matching circuit and a frequency of a radio frequency (RF) generator are both being used to tune plasma impedance, feedback is used from each state individually, but the tuning is greatly improved if each state of a plurality of pulsing states is aware of what the other state is doing. One of the states is a lower powered state and another one of the states is a higher powered state. The lower powered state has a lower amount of power, e.g., root mean square power, etc., compared to the higher powered state. A feedback mechanism which exists between the two or more pulsing states and the impedance matching circuit is described to avoid instabilities and to achieve minimum reflected power. For example, for a 13.56 megahertz (MHz) centered RF generator which is used to drive a bias, as power supplied by the RF generator is increased, a load becomes increasingly more capacitive, and as the power supplied by the RF generator is decreased, the load becomes increasingly more inductive. As a result for a two state bias pulsing scheme, with a given fixed match position, e.g., impedance, capacitance, inductance, positions of circuit components, etc., of the impedance matching circuit, the lower powered state tunes to a lower frequency than the high powered state. In many cases, the high powered state will be tuned with the impedance matching circuit as that will be the state which does the etching and it is desirable to have a low reflected power in the etch state. However, setting a first state frequency, e.g., the high powered state frequency, is important for success of frequency tuning for a second state, e.g., the low powered state. If the frequency for the first state is set too low, then there is not enough frequency range on the RF generator for power of the second state to reach a set point, and if the high powered state frequency is set too high, it can infringe on a change in power with respect to change in plasma impedance, e.g., dP/dZ, etc., or create plasma instability depending on chemistry. The systems and methods described herein provide an auto sweep of the frequency in the first state, e.g., S1, but using feedback from the second state to determine which direction to go and when to stop. In one embodiment, the state S1 is the high powered state.

This is different from some frequency tuning algorithms that rely on feedback from its own state, not other states. For example, in a method of frequency tuning, during each state, the impedance matching circuit is in the fixed match position while the RF generator adjusts its RF frequency to achieve a lowest reflection coefficient. As another example, in pulsing schemes with the two states and thus two impedances, the impedance matching circuit is fixed such that during each state, a real part of impedance is being tuned by the impedance matching circuit and a reactive part of the impedance is tuned by the frequency. This means that there is some finite reflected power in both the states.

In some embodiments, the methods, described herein, include impedance tuning in dual state pulsing. For example, the impedance matching circuit is used to tune in one state, e.g., the high powered state or the low powered state, to achieve nearly 0 reflected power, and frequency of the RF generator is used to tune the other state, e.g., the low powered state or the high powered state. A match tuned state in which the impedance matching circuit is used to tune will achieve zero or nearly zero reflected power but a frequency tuned state in which the frequency of the RF generator is used to tune may have slightly higher reflected power. Depending on what the frequency is in the match tuned state, an iterative process to find an optimal fixed frequency of the RF generator for the match tuned state is applied. The iterative processor avoids running in an issue of not having enough frequency range in the frequency tuned state, or instabilities in one or both of the states.

In one embodiment, a method for achieving reduction in power reflected towards an RF generator is described. The method includes providing a plurality of set points to the RF generator. The set points include a frequency set point for a first state of a digital pulsed signal, a frequency set point for a second state of the digital pulsed signal, a power set point for the first state of the digital pulsed signal, and a power set point for the second state of the digital pulsed signal. The method further includes adjusting an impedance matching circuit to reduce a variable for the first state to be below a pre-determined variable threshold. The variable is associated with the RF generator. The method includes determining whether the variable for the first state is stable and adjusting the frequency set point for the second state upon determining that the variable for the first state is stable. The operation of adjusting the frequency set point for the second state is performed to reduce the variable for the second state to be lower than a pre-set variable threshold. The method also includes determining whether the variable for the second state is stable. The method includes changing the frequency set point for the first state in response to determining that the variable for the second state is not stable to achieve the reduction in power reflected towards the RF generator.

Some advantages of the herein described systems and methods include automatically finding optimal frequencies for application in both states. For example, one or more variables, e.g., gamma, or voltage standing wave ratio, etc., are calculated during the state S1 and a state S2, e.g., the low powered state, the second state, etc. The one or more variables are used to tune a frequency of the RF generator during the state S1 while achieving a low gamma during the state S1, a low gamma during the state S2, a stable gamma during the state S1, and a stable gamma during the state S2. By tuning the frequency of the RF generator during the state S1, there is a reduction in power that is reflected towards the RF generator from a plasma chamber. The reduction in the reflected power increases efficiency in processing of a wafer in the plasma chamber and also reduces chances of damage to components within the RF generator.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

Figure 1:
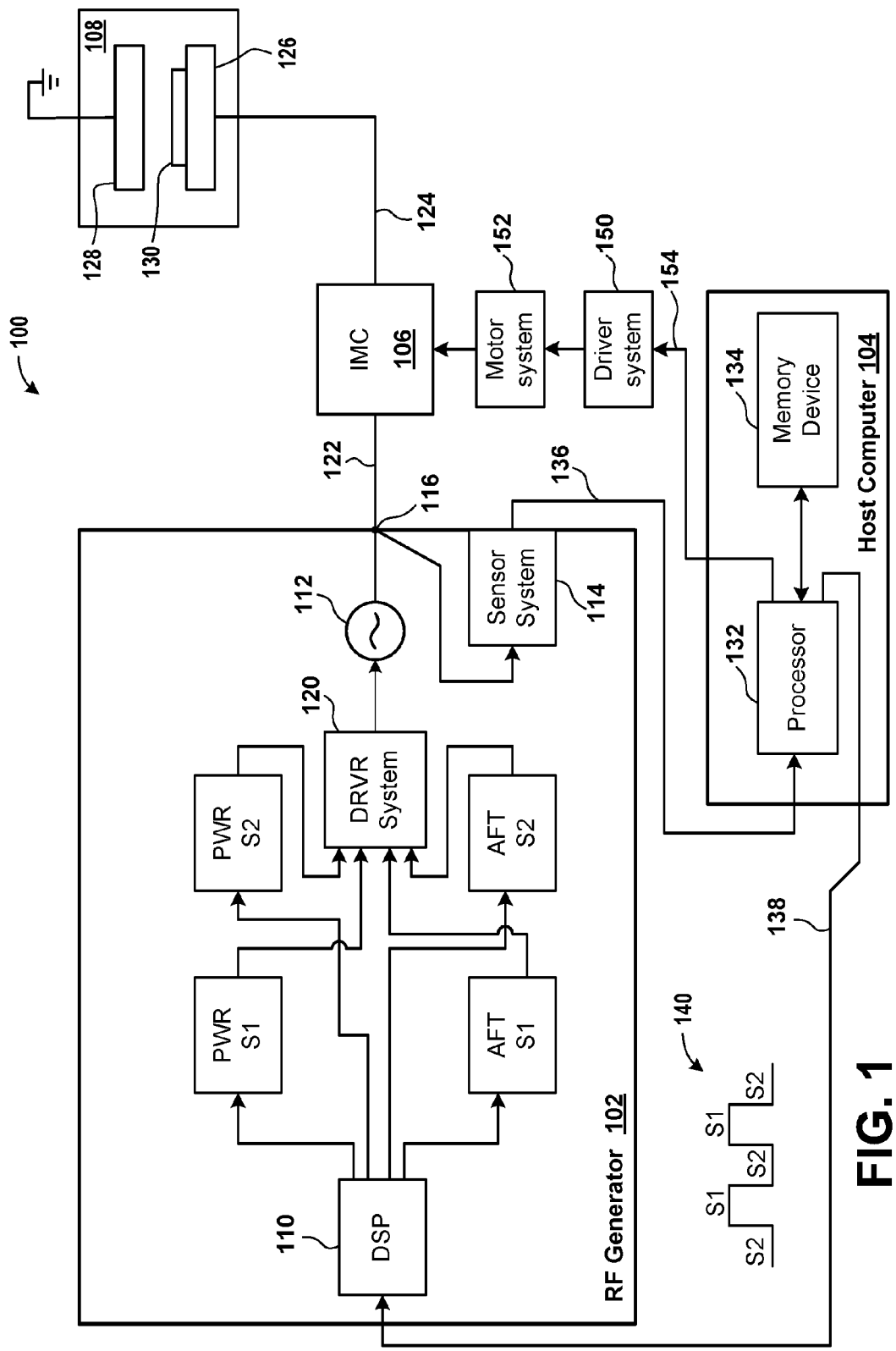
FIG. 1 is a block diagram of an embodiment of a plasma tool for frequency and match tuning in one state and frequency tuning in the other state.

The following embodiments describe systems and methods for frequency and match tuning in one state and frequency tuning in the other state. It will be apparent that the present embodiments may be practiced without some or all of these specific details. In other instances, well known process operations have not been described in detail in order not to unnecessarily obscure the present embodiments.

In some embodiments, the methods, described herein, use feedback from a radio frequency (RF) generator from both states S1 and S2 to scan a frequency for a match tuned high powered state, which is the state S1, while utilizing a frequency tuning algorithm for the fixed match frequency tuned low powered state, which is the state S2. The fixed match frequency tuned low powered state is one in which an impedance matching circuit (IMC) is not tuned, e.g., has a fixed impedance, has fixed positions of circuit components, has fixed capacitance, has fixed inductance, etc.

In various embodiments, one of the methods is executed as follows. For all processes, e.g., recipes, etc., the state S1 bias frequency is set to 13.56 megahertz (MHz) or middle of a frequency tuning range, while the state S2 bias frequency is set to 12.882 MHz or a bottom of the frequency tuning range. It should be noted that instead of 13.56 MHz, another pre-determined frequency value, e.g., 13 MHz, 13.2 MHz, or 13.5, is used and instead of 12.882 MHz, another pre-determined frequency value, e.g., 12 MHz, 12.2 MHz, or 12.5 MHz, is used. When the RF generator is turned on to generate an RF signal, the IMC will start to tune an impedance for the state S1, and the state S2 frequency will stay at 12.882 MHz or another pre-determined value until a reflection coefficient, such as gamma, in the state S1 drops below a certain threshold, e.g., 0.2 gamma, etc., signaling that the state S1 is nearly tuned and the IMC will not be tuned much. At this point the state S2 frequency will start to scan at a pre-set frequency step size and a pre-set step time, and once the gamma of the state S2 drops below a specific value, e.g., 0.7 gamma, 0.6 gamma, 0.5 gamma, 0.2 gamma, etc., then the state S2 frequency tuning algorithm initiates and tune to a lowest reflection coefficient, such as gamma, for the state S2. The delay before the state S2 frequency tuning algorithm in waiting for the impedance matching circuit to tune is useful, otherwise the state S2 frequency tuning algorithm may find false minimas in the reflection coefficient. Then if state S1 and S2 power set points are met and the reflection coefficients in both the states S1 and S2 are stable then a matching condition is achieved. However, if either the state S1 or state S2 power set point is not met or if the reflection coefficient in either state is not stable based on standard deviation values calculated by the RF generator, then both states frequency will freeze, and the state S1 frequency will start to scan upwards towards a higher frequency or downwards towards a lower frequency with a predetermined step size and a predetermined step time, and then waits for the impedance matching circuit to tune by detecting the gamma threshold for the state S1 and stability. If there is no stabilization, the frequency scan continues until the state S1 gamma is low and stable. Then the state S2 frequency tuning will start again. If the state S2 gamma is low and stable, the method stops. If the state S2 gamma is high or unstable, the method starts again with the state S1 until a solution is found or none is found and the process is found to be outside of a process window, e.g., a process recipe, outside of chemistry parameters, outside of gap parameters, outside of etch parameters, outside of deposition parameters, etc.

FIG. 1 is a block diagram of an embodiment of a plasma tool 100 for frequency and match tuning in one state and frequency tuning in the other state. The plasma tool 100 includes a radio frequency (RF) power generator 102, a host computer 104, an IMC 106, a plasma chamber 108, a driver system 150, and a motor system 152. The RF generator 102 is a 400 kilohertz (kHz), or a 2 MHz, or a 13.56 MHz, or a 27 MHz, or a 60 MHz RF generator. Examples of the host computer 104 include a desktop computer, or a laptop computer, or a smartphone, or a tablet, etc.

The RF generator 102 includes a digital signal processor (DSP) 110, a power controller PWRS1, another power controller PWRS2, an auto frequency tuner (AFT) AFTS1, another auto frequency tuner AFTS2, an RF power supply 112, a sensor system 114, and a driver system 120. Examples of the RF power supply 112 include an RF oscillator. As used herein, a processor is an application specific integrated circuit (ASIC), or a programmable logic device (PLD), or a central processing unit (CPU), or a microprocessor, or a microcontroller. As used herein, a controller is application specific integrated circuit (ASIC), or a programmable logic device (PLD), or a central processing unit (CPU), or a microprocessor, or a microcontroller, or a processor. Examples of the sensor system 114 include one or more sensors, e.g., a complex voltage and current sensor, a voltage reflection coefficient sensor, an impedance sensor, a delivered power sensor, a voltage sensor, a supplied power sensor, a reflected power sensor, etc. In some embodiments, the terms supplied power and forward power are used interchangeably herein. The delivered power is a difference between the supplied power and the reflected power. Examples of the driver system 120 include one or more transistors.

The plasma chamber 108 includes a chuck 126 and an upper electrode 128 that faces the chuck 126. The upper electrode 128 is coupled to a ground potential. The plasma chamber 108 also includes other components (not shown), e.g., an upper dielectric ring surrounding the upper electrode 128, an upper electrode extension surrounding the upper dielectric ring, a lower dielectric ring surrounding the chuck 126, a lower electrode extension surrounding the lower dielectric ring, an upper plasma exclusion zone (PEZ) ring, a lower PEZ ring, etc. The upper electrode 122 is located opposite to and facing the chuck 126, which includes a lower electrode. For example, the chuck 126 includes a ceramic layer that is attached to top of the lower electrode and a facility plate that is attached to bottom of the lower electrode. The upper electrode 122 is coupled to a ground potential.

A substrate 130, e.g., a semiconductor wafer, is supported on an upper surface of the chuck 126. Integrated circuits, e.g., an application specific integrated circuit (ASIC), a programmable logic device (PLD), etc., are developed on the substrate 130 and the integrated circuits are used in a variety of devices, e.g., cell phones, tablets, smart phones, computers, laptops, networking equipment, etc. The lower electrode is made of a metal, e.g., anodized aluminum, alloy of aluminum, etc. Also, the upper electrode 128 is made of a metal, e.g., aluminum, alloy of aluminum, etc.

The upper electrode 128 includes one or more holes that are coupled to a central gas feed (not shown). The central gas feed receives one or more process gases from a gas supply (not shown). Examples of the one or more process gases include an oxygen-containing gas, such as $O_2$. Other examples of the one or more process gases include a fluorine-containing gas, e.g., tetrafluoromethane ($CF_4$), sulfur hexafluoride ($SF_6$), hexafluoroethane ($C_2F_6$), etc.

Examples of the motor system 152 include one or more electric motors, e.g., a stepper motor, etc. The driver system 150 includes one or more drivers, e.g., one or more transistors, etc. A driver, e.g., a circuit of one or more transistors, a current generator, etc., of the driver system is coupled to a corresponding motor of the motor system 152. For example, a first driver of the driver system 150 is coupled to a first motor of the motor system 152 and a second driver of the driver system 150 is coupled to a second motor of the motor system 152. The processor 132 is coupled to the driver system 150 via a cable 154. A circuit component, e.g., an inductor, a capacitor, etc., of the IMC 106 is coupled to a corresponding motor of the motor system 152 via a connection mechanism, e.g., one or more shafts, or a combination of one or more gears and shafts. For example, a first circuit component of the IMC 106 is coupled to a first motor of the motor system 152 and a second circuit component of the IMC 106 is coupled to a second motor of the motor system 152.

The sensor system 114 is coupled to an output 116 of the RF generator 102, and the output 116 is also an output of the RF power supply 112. In some embodiments, the sensor system 114 is located outside a housing of the RF generator 102 and is coupled to the output 116 of the RF generator 102. For example, the sensor system 114 includes a directional coupler coupled to an oscilloscope for measuring the voltage reflection coefficient at the output 116. In various embodiments, the sensor system 114 is coupled to any point on the RF cable 122. In several embodiments, the sensor system 114 is coupled to an input of the IMC 106 or to an output of the IMC 106. In some embodiments, the sensor system 114 is coupled to a point on an RF transmission line 124. The RF transmission line 124 includes a metal rod that is surrounded by an insulator that is further surrounded by a sheath. The metal rod is coupled to a cylinder via an RF strap and the cylinder is coupled to the chuck 126.

The DSP 110 is coupled to the power controllers PWRS1 and PWRS2, and to the auto-frequency tuners AFTS1 and AFTS2. Moreover, the power controllers PWRS1 and PWRS2 and the auto-frequency tuners AFTS1 and AFTS2 are coupled to the driver system 120. The driver system 120 is coupled to the RF power supply 112. The RF power supply 112 is coupled via the output 116 and an RF cable 122 to the input of the IMC 106. The output of the IMC 106 is coupled via the RF transmission line 124 to the lower electrode of the chuck 126. In some embodiments, the RF transmission line 124 is coupled to the upper electrode 128 and the lower electrode 126 is coupled to the ground potential.

The IMC 106 includes electric circuit components, e.g., inductors, capacitors, etc. to match an impedance of a load coupled to the output of the IMC 106 with an impedance of a source coupled to the input of the IMC 106. For example, the IMC 106 matches an impedance of the plasma chamber 108 and the RF transmission line 124 coupled to the output of the IMC 106 with an impedance of the RF generator 102 and the RF cable 112, which is coupled to the input of the IMC 106. In one embodiment, one or more of the electrical circuit components of the IMC 106 are tuned to facilitate a match between an impedance of the load coupled to the output of the IMC 106 with that of the source coupled to the input of the IMC 106. The IMC 106 reduces a probability of power being reflected a direction towards the source, e.g., from the load towards the source.

The host computer 104 includes a processor 132 and a memory device 134. The processor 132 is coupled to the memory device 134. Examples of a memory device include a random access memory (RAM) and a read-only memory (ROM). To illustrate, a memory device is a flash memory, a hard disk, or a storage device, etc. A memory device is an example of a computer-readable medium. The processor 132 is coupled to the sensor system 114 via a cable 136 and to the DSP 110 via a cable 138. Examples of the cable 136 or the cable 138 include a cable that is used to transfer data in a serial manner, a cable that is used to transfer data in a parallel manner, and a cable that is used to transfer data by applying a universal serial bus (USB) protocol.

A control circuit of the processor 132 is used to generate a pulsed signal 140, e.g., a transistor-transistor logic (TTL) signal, a digital pulsing signal, a clock signal, a signal with a duty cycle, etc. Examples of the control circuit of the processor 132 includes a TTL circuit.

The pulsed signal 140 includes the states S1 and S2. For example, the state S1 of the pulsed signal 140 has a logic level of one and the state S2 of the pulsed signal 140 has a logic level of zero. In various embodiments, the states S1 and S2 execute once during a clock cycle of the pulsed signal 140 and repeat with multiple clock cycles. For example, the clock cycle includes the states S1 and S2 and another clock cycle includes the states S1 and S2. To illustrate, during a half period of a clock cycle, the state S1 is executed and during the remaining half period of the clock cycle, the state S2 is executed.

In some embodiments, each of the states S1 and S2 has a duty cycle of 50%. In several embodiments, each of the states S1 and S2 has a different duty cycle. For example, the state S1 has an x % duty cycle and the state S2 has a duty cycle of (100−x) %, where x is an integer.

In various embodiments, instead of the control circuit of the processor 132, a clock source, e.g., a crystal oscillator, etc., is used to generate an analog clock signal, which is converted by an analog-to-digital converter into a digital signal similar to the pulsed signal 140. For example, the crystal oscillator is made to oscillate in an electric field by applying a voltage to an electrode near the crystal oscillator. In some embodiments, instead of the processor 132, a digital clock source generates the pulsed signal 140. In various embodiments, the pulsed signal 140 is generated by the control circuit located within a master RF generator (not shown) and sent to the RF generator 102 via a cable. In several embodiments, the pulsed signal 140 is generated by the control circuit within the RF generator 102, which acts as a master generator for other RF generators to use.

The processor 132 accesses a recipe from the memory device 134. Examples of the recipe include a power set point for the state S1, a power set point for the state S2, or a frequency set point for the state S1, or a frequency set point for the state S2, or a chemistry of the one or more process gases, or a gap between the upper electrode 128 and the chuck 126, or a combination thereof. The processor 132 sends an instruction with the pulsed signal 140, the power set point for the state S1, the power set point for the state S2, the frequency set point for the state S1, and the frequency set point for the state S2 to the DSP 110 via the cable 138.

The DSP 110 determines from the instruction that the power set point for the state S1 is to be applied during the state S1 of the pulsed signal 140, the power set point for the state S2 is to be applied during the state S2 of the pulsed signal 140, the frequency set point for the state S1 is to be applied during the state S1 of the pulsed signal 140, and the frequency set point for the state S2 is to be applied during the state S2 of the pulsed signal 140. During the state S1 of the clock cycle, the DSP 110 sends the power set point for the state S1 to the power controller PWRS1. Similarly, during the state S2 of the clock cycle, the DSP 110 sends the power set point for the state S2 to the power controller PWRS2. Moreover, during the state S1 of the clock cycle, the DSP 110 sends the frequency set point for the state S1 to the auto-frequency tuner AFTS1. Also, during the state S2 of the clock cycle, the DSP 110 sends the frequency set point for the state S2 to the auto-frequency tuner AFTS2.

Upon receiving the power set point for the state S1, the power controller PWRS1 determines an amount of current corresponding to, e.g., having a one-to-one relationship with, mapped to, linked to, etc., the power set point for the state S1. Based on the amount of current that is to be generated by the driver system 120 during the state S1, the power controller PWRS1 generates a command signal and sends the command signal to the driver system 120. During the state S1, in response to receiving the command signal, the driver system 120 generates and sends a current signal having the amount of current to the RF power supply 112. The RF power supply 112, upon receiving the current signal generates an RF signal having the power set point for the state S1 and supplies the RF signal via the output 116 and the RF cable 122 to the input of the IMC 106.

Similarly, upon receiving the power set point for the state S2, the power controller PWRS2 determines an amount of current corresponding to, e.g., having a one-to-one relationship with, mapped to, linked to, etc., the power set point for the state S2. Based on the amount of current that is to be generated by the driver system 120 during the state S2, the power controller PWRS2 generates a command signal and sends the command signal to the driver system 120. During the state S2, in response to receiving the command signal, the driver system 120 generates and sends a current signal having the amount of current to the RF power supply 112. The RF power supply 112, upon receiving the current signal generates the RF signal having the power set point for the state S2 and supplies the RF signal via the output 116 and the RF cable 122 to the input of the IMC 106.

Moreover, upon receiving the frequency set point for the state S1, the auto-frequency tuner AFTS1 determines an amount of current corresponding to, e.g., having a one-to-one relationship with, mapped to, linked to, etc., the frequency set point for the state S1. Based on the amount of current that is to be generated by the driver system 120 during the state S1, the auto-frequency tuner AFTS1 generates a command signal and sends the command signal to the driver system 120. During the state S1, in response to receiving the command signal, the driver system 120 generates and sends a current signal having the amount of current to the RF power supply 112. The RF power supply 112, upon receiving the current signal generates the RF signal having the frequency set point for the state S1 and supplies the RF signal via the output 116 and the RF cable 122 to the input of the IMC 106. The RF signal having the power set point for the state S1 and the frequency set point for the state S1 is the RF signal generated during the state S1.

Similarly, upon receiving the frequency set point for the state S2, the auto-frequency tuner AFTS2 determines an amount of current corresponding to the frequency set point for the state S2. Based on the amount of current that is to be generated by the driver system 120 during the state S2, the auto-frequency tuner AFTS2 generates a command signal and sends the command signal to the driver system 120. During the state S2, in response to receiving the command signal, the driver system 120 generates and sends a current signal having the amount of current to the RF power supply 112. The RF power supply 112, upon receiving the current signal generates the RF signal having the frequency set point for the state S2 and supplies the RF signal via the output 116 and the RF cable 122 to the input of the IMC 106. The RF signal having the power set point for the state S2 and the frequency set point for the state S2 is the RF signal generated during the state S2.

The input of the IMC 106 receives the RF signal via the RF cable 122 from the output 116 and matches an impedance of the load coupled to the output of the IMC 106 with an impedance of the source coupled to the input of the IMC 106 to generate a modified RF signal at the output of the IMC 106. The modified RF signal is sent via the RF transmission line 124 to the lower electrode of the chuck 126. When the one or more process gases are supplied between the upper electrode 128 and the chuck 126 and the modified RF signal is supplied to the lower electrode 120, the one or more process gases are ignited to generate plasma within the plasma chamber 104. The plasma is used to process, e.g., etch, deposit materials on, clean, sputter, etc., the substrate 130.

During each state S1 and S2, the sensor system 114 senses one or more parameters, e.g., supplied voltage, reflected voltage, reflected power, supplied power, delivered power, complex impedance, voltage reflection coefficient, complex voltage and current, etc., at the output 116. The supplied power is RF power that is supplied by the RF signal that is generated by the RF generator 102. The reflected power is RF power reflected towards the RF generator 102 as a result of impedance seen by the RF generator 102 at the output 116 when the supplied power is provided from the RF generator 102 to the IMC 106. For example, the reflected power includes power reflected from the plasma of the plasma chamber 108, via the RF transmission line 124, the IMC 106 and the RF cable 122 towards the RF generator 102. The voltage reflection coefficient is represented as a Greek symbol gamma ($\gamma$) and is a complex number that has a magnitude and a phase. The one or more parameters that are sensed are sent from the sensor system 114 via the cable 136 to the processor 132. The processor 132 determines one or more variables from the one or more parameters. For example, the processor 132 identifies the one or more parameters that are measured and received from the sensor system 114, and stores the one or more parameters within the memory device 134. In this example, the one or more variables are the one or more parameters that are identified by the processor 132. As another example, the processor 132 calculates one or more factors, e.g., gamma, frequency of the RF signal supplied via the output 116, etc., from the one or more parameters, and stores the one or more factors within the memory device 134. In this example, the one or more variables are the one or more factors that are calculated by the processor 132. To illustrate, the processor 132 converts the RF signal supplied via the output 116 and having the supplied power from a time domain to a frequency domain to determine the frequency of the RF signal that is supplied via the output 116. As another illustration, gamma $\gamma$ describes how much of the supplied RF voltage of the RF signal generated and supplied by the RF generator 102 is reflected towards the RF generator 102. As yet another illustration, the gamma is calculated by the processor 132 a ratio of voltage of an RF signal that is reflected towards the RF generator 102 to voltage of the RF signal that is generated and supplied by the RF generator 102.

The processor 132 tunes, such as increases or decreases, increases in a step-wise fashion, or decreases in a step-wise fashion, the frequency set point for the state S1 based on the one or more variables for the state S1, such as measured during the state S1, and the one or more variables for the state S2, such as measured during the state S2, to generate a modified frequency set point for the state S1. During the state S1, processor 132 sends the modified frequency set point for the state S1 via the cable 138 to the DSP 110, which implements the modified frequency set point for the state S1 in a manner described above. For example, during the state S1, the DSP 110 sends the modified frequency set point for the state S1 to the auto-frequency tuner AFTS1, which generates a command signal so that the RF signal that is generated by the RF power supply 112 has the modified frequency set point. To illustrate, upon receiving the modified frequency set point for the state S1, the auto-frequency tuner AFTS1 determines an amount of current signal corresponding to, e.g., having a one-to-one relationship with, mapped to, linked to, etc., the modified frequency set point for the state S1. Based on the amount of current that is to be generated by the driver system 120 during the state S1, the auto-frequency tuner AFTS1 generates a command signal and sends the command signal to the driver system 120. During the state S1, in response to receiving the command signal, the driver system 120 generates and sends a current signal having the amount of current to the RF power supply 112. The RF power supply 112, upon receiving the current signal generates the RF signal having the modified frequency set point for the state S1 and supplies the RF signal via the output 116 and the RF cable 122 to the input of the IMC 106.

Moreover, after the frequency set point for the state S1 is tuned, the processor 132 tunes, such as increases, decreases, or increases in a step-wise fashion, or decreases in a step-wise fashion, the frequency set point for the state S2 based on the one or more variables measured during the state S1 and the one or more variables measured during the state S2 to generate a modified frequency set point for the state S2. For example, the processor 132 does not tune the frequency set point for the state S2 until the frequency set point for the state S1 is tuned. During the state S2, the processor 132 sends the modified frequency set point for the state S2 via the cable 138 to the DSP 110, which implements the modified frequency set point for the state S2 in a manner described above. For example, during the state S2, the DSP 110 sends the modified frequency set point for the state S2 to the auto-frequency tuner AFTS2, which generates a command signal so that the RF signal that is generated by the RF power supply 112 has the modified frequency set point. To illustrate, upon receiving the modified frequency set point for the state S2, the auto-frequency tuner AFTS2 determines an amount of current signal corresponding to, e.g., having a one-to-one relationship with, mapped to, linked to, etc., the modified frequency set point for the state S2. Based on the amount of current that is to be generated by the driver system 120 during the state S2, the auto-frequency tuner AFTS2 generates a command signal and sends the command signal to the driver system 120. During the state S2, in response to receiving the command signal, the driver system 120 generates and sends a current signal having the amount of current to the RF power supply 112. The RF power supply 112, upon receiving the current signal generates the RF signal having the modified frequency set point for the state S2 and supplies the RF signal via the output 116 and the RF cable 122 to the input of the IMC 106.

In some embodiments, the terms tuner and controller are used interchangeably herein. An example of an AFT is provided in U.S. Pat. No. 6,020,794, which is incorporated by reference herein in its entirety.

In various embodiments, the power controllers PWRS1 and PWRS2, and the auto-frequency tuners AFTS1 and AFTS2 are modules, e.g., portions, etc., of a computer program that is executed by the DSP 110.

In various embodiments, the power controllers PWRS1 and PWRS2, and the auto-frequency tuners AFTS1 and AFTS2 are separate integrated circuits that are coupled to an integrated circuit of the DSP 110. For example, the power controller PWRS1 is a first integrated circuit, the power controller PWRS2 is a second integrated circuit, the auto-frequency tuner AFTS1 is a third integrated circuit, the auto-frequency tuner AFTS2 is a fourth integrated circuit, and the DSP 110 is a fifth integrated circuit. Each of the first through fourth integrated circuit is coupled to the fifth integrated circuit.

In some embodiments, an example of the state S1 of an RF signal includes the power set point for the state S1 and the frequency set point for the state S1. The power set point for the state S1 is an operational power set point, which is a power level, such as an envelope or a zero-to-peak magnitude, of the RF signal during the state S1. The frequency set point for the state S1 is an operational frequency set point, which is a frequency level, such as an envelope or a zero-to-peak magnitude, of the RF signal during the state S1. Similarly, an example of the state S2 of the RF signal includes the power set point for the state S2 and the frequency set point for the state S2. The power set point for the state S2 is an operational power set point, which is a power level, such as an envelope or a zero-to-peak magnitude, of the RF signal during the state S2. The frequency set point for the state S2 is an operational frequency set point, which is a frequency level, such as an envelope or a zero-to-peak magnitude, of the RF signal during the state S2.

In various embodiments, the power level for the state S2 is lower than the power level for the state S1. To illustrate, all power amounts of an RF signal from which the power level for the state S2 is generated are lower than all power amounts of the RF signal from which the power level for the state S1 is generated. In various embodiments, the power level for the state S2 is greater than the power level for the state S1. To illustrate, all power amounts of the RF signal from which the power level for the state S2 is generated are higher than all power amounts of the RF signal from which the power level for the state S1 is generated. In several embodiments, a level is generated from one or more amounts, e.g., values, magnitudes, etc. For example, a frequency level is generated from one or more frequency values of an RF signal and a power level is generated from one or more power values of an RF signal. To further illustrate, a frequency level is a root mean square value of multiple values of frequencies of an RF signal and a power level is a root mean square value of multiple values of power of the RF signal.

In various embodiments, two or three RF generators are coupled to the IMC 106. For example, an additional RF generator is coupled to the IMC 106 via an RF cable (not shown) to another input of the IMC 106. The additional RF generator is in addition to the RF generator 102. The other input is not the same as the input to which the RF cable 122 is coupled. The additional RF generator has the same structure and function as that of the RF generator 102 except that the additional RF generator has a different operating frequency, e.g., 2 MHz, 27 MHz, 60 MHz, etc., than that of the RF generator 102. For example, the RF generator 102 has an operating frequency of 13.56 MHz and the additional RF generator has an operating frequency of 2 MHz, or 400 kHz, or 27 MHz, or 60 MHz. The IMC 106 combines the RF signals received from the RF generator 102 and the additional RF generator, and matches an impedance of the load coupled to the output of the IMC 106 with that of the source, e.g., the RF generator 102, the additional RF generator, the RF cable 122, and the other RF cable, etc., to generate the modified RF signal at the output of the IMC 106.

In one embodiment, the terms impedance matching circuit and impedance matching network are used herein interchangeably.

Figure 2:
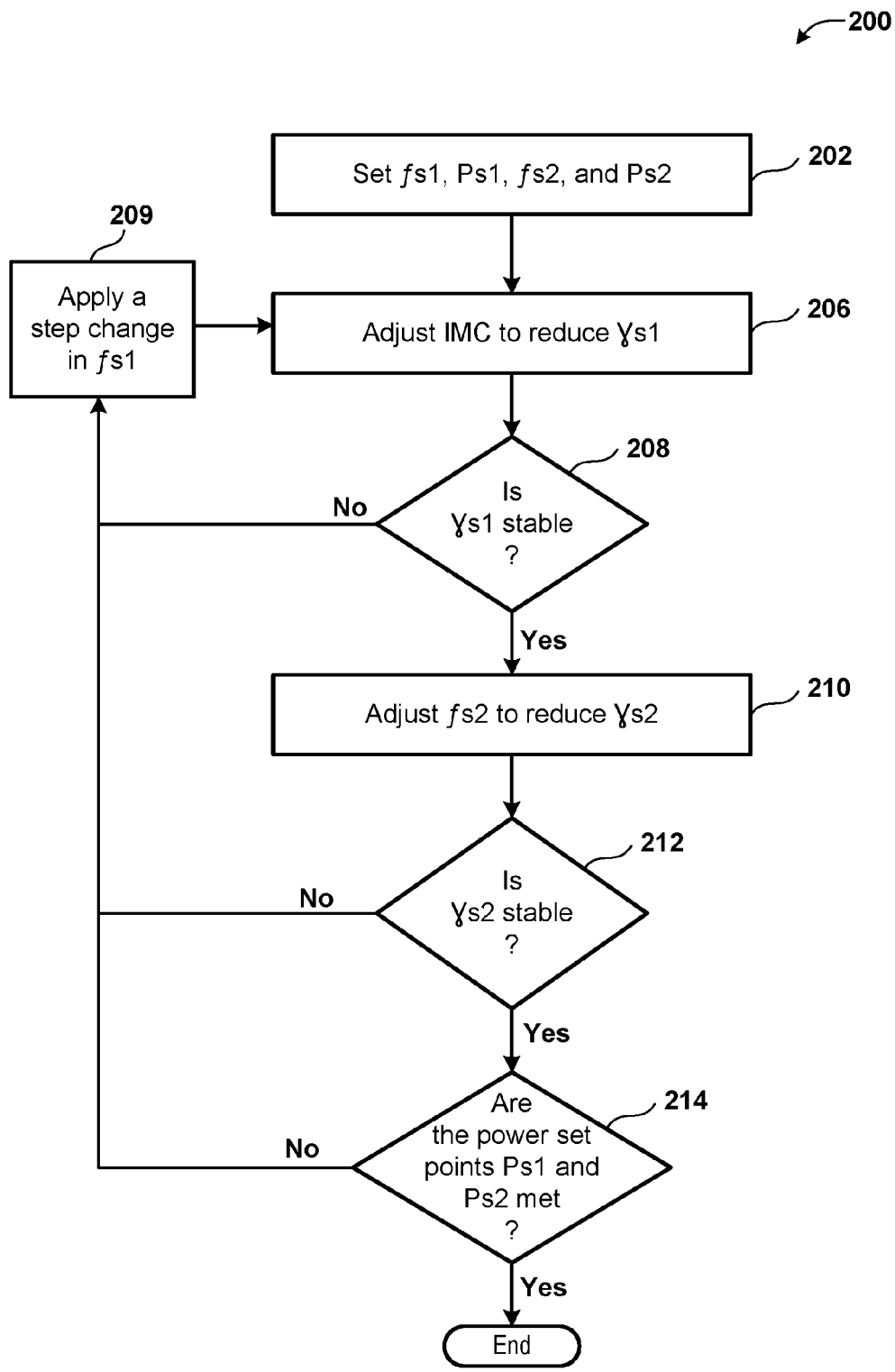
FIG. 2 is a flowchart of an embodiment of a method for tuning a frequency set point for a state S1 based on one or more variables for the state S1 and the one or more variables for a state S2.

FIG. 2 is a flowchart of an embodiment of a method 200 for tuning the frequency set points fs1 and fs2 based on the one or more variables for the state S1 and the one or more variables for the state S2. The method 200 is executed by the plasma tool 100 (FIG. 1). In an operation 202 of the method 200, a frequency set point fs1 for the state S1, a power set point Ps1 for the state S1, a frequency set point fs2 for the state S2, and a power set point Ps2 for the state S2 are set. For example, in a manner described above with reference to FIG. 1, the processor 132 (FIG. 1) of the host computer 104 sends the set points fs1, Ps1, fs2, and Ps2 via the cable 138 (FIG. 1) to the DSP 110 (FIG. 1). The DSP 110 sends the frequency set point fs1 to the auto-frequency tuner AFTS1, the frequency set point fs2 to the auto-frequency tuner AFTS2, the power set point Ps1 to the power controller PWRS1, and the power set point Ps2 to the power controller PWRS2. During the state S1, the power controller PWRS1 and the auto-frequency tuner AFTS1 control the driver system 120 and the RF power supply 112, in a manner described above, to generate the RF signal having the power set point Ps1 and the frequency set point fs1 at the output 116. Similarly, during the state S2, the power controller PWRS2 and the auto-frequency tuner AFTS2 control the driver system 120 and the RF power supply 112, in a manner described above, to generate the RF signal having the power set point Ps2 and the frequency set point fs2 at the output 116.

Based on the one or more variables for the state S1 determined by the processor 132, in an operation 206 of the method 200, the processor 132 determines to control a position of one or more of the electric circuit components of the IMC 106. For example, the processor 132 determines that one of the variables, e.g., yS1, for the state S1 is not below a pre-determined variable threshold for the state S1, e.g., pre-determined gamma, etc., which is stored in the memory device 134. Upon determining that the one of the variables for the state S1 is not below the pre-determined variable threshold for the state S1, the processor 132 sends a command signal via the cable 154 (FIG. 1) to the driver system 150. Based on the command signal, the driver of the driver system 150 generates a current signal and sends the current signal to the motor of the motor system 152 (FIG. 1). The motor rotates to rotate the connection mechanism to further change a position of the circuit component, e.g., a position of a plate of a capacitor, a position of a core of an inductor, etc., of the IMC 106 to modify an inductance and/or a capacitance of the IMC 106. In the operation 206, the processor 132 continues to adjust one or more positions of the corresponding one or more circuit components via the motor system 152 until the one of the variables is below the pre-determined variable threshold.

In an operation 208 of the method 200, the processor 132 determines whether the one of the variables for the state S1, e.g., γs1, is stable. For example, the processor 132 determines that all or a pre-determined number of values, such as magnitudes, of the one of the variables for the state S1 lie within a pre-determined range for the state S1, e.g., within a standard deviation of a pre-determined value of the one of the variables for the state S1, etc. The pre-determined number of values of the one of the variables for the state S1 and the pre-determined range are stored in the memory device 134 for access by the processor 132. The processor 132 determines that the one of the variables for the state S1 is not stable upon determining that all or the pre-determined number of values of the one of the variables for the state S1 lie outside the pre-determined range. On the other hand, the processor 132 determines that the one of the variables for the state S1 is stable upon determining that all or the predetermined number of values of the one of the variables for the state S1 lie within the pre-determined range.

Upon determining that the one of the variables for the state S1 is not stable in the operation 208, an operation 209 of the method 200 is performed. During the operation 209, a pre-determined step change, e.g., a pre-determined step increase, a pre-determined step decrease, etc., of a pre-determined step time is applied to the frequency set point fs1. For example, the processor 132 increases the frequency set point fs1 by a pre-determined step size ss1 to generate a frequency set point fs1+ss1 for the pre-determined step time. The pre-determined step size and the pre-determined step time are stored in the memory device 134 for access by the processor 132. In some embodiments, the pre-determined step size and the pre-determined step time are received from a user via a selection made using an input device, e.g., a keyboard, a mouse, a keypad, etc., that is coupled to the host computer 104. An example of the pre-determined step time is a portion, e.g., half, third, one-fourth, etc., of a time period for which the state S1 of the clock cycle of the pulsed signal 140 occurs. The frequency set point fs1+ss1 is provided from the processor 132 to the DSP 110 via the cable 138. The DSP 110 sends the frequency set point fs1+ss1 to the auto-frequency tuner AFTS1. During the state S1, the auto-frequency tuner AFTS1 controls the driver system 120 and the RF power supply 112, in a manner described above, to generate an RF signal having the frequency set point fs1+ss1 at the output 116. As another example, the processor 132 decreases the frequency set point fs1 by the pre-determined step size ss1 to generate a frequency set point fs1−ss1 for the pre-determined step time. The frequency set point fs1−ss1 is provided from the processor 132 to the DSP 110 via the cable 138. The DSP 110 sends the frequency set point fs1−ss1 to the auto-frequency tuner AFTS1. During the state S1, the auto-frequency tuner AFTS1 controls the driver system 120 and the RF power supply 112, in a manner described above, to generate an RF signal having the frequency set point fs1−ss1 at the output 116. The operations 206, 208, and 209 are repeated until the one of the variables for the state S1 is stable. In one embodiment, the operations 208 and 209 are repeated without repeating the operation 206 until the one of the variables for the state S1 is stable.

On the other hand, upon determining that the one of the variables for the state S1 is stable in the operation 208, an operation 210 of the method 200 is performed. In the operation 210, the processor 132 determines that one of the variables for the state S2, such as $\gamma S2$, is not below a pre-set variable threshold for the state S2, e.g., pre-determined gamma, etc., which is stored in the memory device 134. Upon determining that the one of the variables for the state S2 is not below the pre-set variable threshold for the state S2, a pre-set step change, e.g., a pre-set step increase, a pre-set step decrease, etc., of a pre-set step time is applied to the frequency set point fs2. For example, upon determining that the one of the variables for the state S2 is not below the pre-set variable threshold for the state S2, the processor 132 increases the frequency set point fs2 by the pre-determined step size ss2 to generate a frequency set point fs2+ss2 for the pre-set step time. The pre-set step size and the pre-set step time are stored in the memory device 134 for access by the processor 132. In some embodiments, the pre-set step size and the pre-set step time are received from the user via a selection made using the input device that is coupled to the host computer 104. An example of the pre-set step time is a portion, e.g., half, third, one-fourth, etc., of a time period for which the state S2 of the clock cycle of the pulsed signal 140 occurs. The frequency set point fs2+ss2 is provided from the processor 132 to the DSP 110 via the cable 138. The DSP 110 sends the frequency set point fs2+ss2 to the auto-frequency tuner AFTS2. During the state S2, the auto-frequency tuner AFTS2 controls the driver system 120 and the RF power supply 112, in a manner described above, to generate an RF signal having the frequency set point fs2+ss2 at the output 116. In the operation 210, the processor 132 and the RF generator 102 continue to adjust the frequency set point fs2+ss2 until the one of the variables is below the pre-set variable threshold for the state S2. As another example, upon determining that the one of the variables for the state S2 is not below the pre-set variable threshold for the state S2, the processor 132 decreases the frequency set point fs2 by the pre-determined step size ss2 to generate a frequency set point fs2−ss2 for the pre-set step time. The frequency set point fs2−ss2 is provided from the processor 132 to the DSP 110 via the cable 138. The DSP 110 sends the frequency set point fs2−ss2 to the auto-frequency tuner AFTS2. During the state S2, the auto-frequency tuner AFTS2 controls the driver system 120 and the RF power supply 112, in a manner described above, to generate an RF signal having the frequency set point fs2−ss2 at the output 116. In the operation 210, the processor 132 and the RF generator 102 continue to adjust the frequency set point fs2−ss2 until the one of the variables is below the pre-set variable threshold for the state S2. The processor 132 continues to apply the pre-set step change in the operation 210 until the one of the variables for the state S2 is below the pre-set variable threshold for the state S2.

In some embodiments, the pre-set variable threshold for the state S2 is the same as the pre-determined variable threshold for the state S1. In various embodiments, the pre-set variable threshold for the state S2 is greater than or less than the pre-determined variable threshold for the state S1.

In an operation 212 of the method 200, the processor 132 determines whether the one of the variables, e.g., $\gamma s2$, for the state S2 is stable. For example, the processor 132 determines that all or a pre-set number of values, such as magnitudes, of the one of the variables for the state S2 lie within a pre-set range for the state S2, e.g., within a standard deviation of a pre-set value of the one of the variables for the state S2, etc. The pre-set number of values of the one of the variables for the state S2 and the pre-set range are stored in the memory device 134 for access by the processor 132. The processor 132 determines that the one of the variables for the state S2 is not stable upon determining that all or the pre-set number of values of the one of the variables for the state S2 lie outside the pre-set range. On the other hand, the processor 132 determines that the one of the variables for the state S2 is stable upon determining that all or the pre-set number of values of the one of the variables for the state S2 lie within the pre-set range.

In some embodiments, the pre-set number of values of the one of the variables for the state S2 is the same as or different from, e.g., greater than, less than, the pre-determined number of values of the one of the variables for the state S1. In various embodiments, the pre-set range for the state S2 is greater than or lower than the pre-determined range for the state S1.

Upon determining that the one of the variables for the state S2 is not stable in the operation 212, the operation 209 of the method 200 is performed. During the operation 209, the pre-determined step increase of the pre-determined step time is applied to a frequency set point at the time the operation 209 is performed. For example, when the frequency set point at the time before the operation 209 is performed is fs1, the processor 132 increases the frequency set point fs1 by the pre-determined step size ss1 to generate the frequency set point fs1+ss1 for the pre-determined step time. The frequency set point fs1+ss1 is provided from the processor 132 to the DSP 110 via the cable 138. The DSP 110 sends the frequency set point fs1+ss1 to the auto-frequency tuner AFTS1. During the state S1, the auto-frequency tuner AFTS1 controls the driver system 120 and the RF power supply 112, in a manner described above, to generate the RF signal having the frequency set point fs1+ss1 at the output 116. The operations 206, 208, 210, 212, and 209 are repeated until the one of the variables for the state S2 is stable. As another example, when the frequency set point at the time before the operation 209 is performed is fs1, the processor 132 decreases the frequency set point fs1 by the pre-determined step size ss1 to generate the frequency set point fs1−ss1 for the pre-determined step time. The frequency set point fs1−ss1 is provided from the processor 132 to the DSP 110 via the cable 138. The DSP 110 sends the frequency set point fs1−ss1 to the auto-frequency tuner AFTS1. During the state S1, the auto-frequency tuner AFTS1 controls the driver system 120 and the RF power supply 112, in a manner described above, to generate the RF signal having the frequency set point fs1−ss1 at the output 116. The operations 206, 208, 210, 212, and 209 are repeated until the one of the variables for the state S2 is stable.

As yet another example, when the frequency set point at the time before the operation 209 is performed is fs1+ss1, the processor 132 increases the frequency set point fs1+ss1 by the pre-determined step size ss1 to generate a frequency set point fs1+ss1+ss1 for the pre-determined step time. The frequency set point fs1+ss1+ss1 is provided from the processor 132 to the DSP 110 via the cable 138. The DSP 110 sends the frequency set point fs1+ss1+ss1 to the auto-frequency tuner AFTS1. During the state S1, the auto-frequency tuner AFTS1 controls the driver system 120 and the RF power supply 112, in a manner described above, to generate the RF signal having the frequency set point fs1+ss1+ss1 at the output 116. The operations 206, 208, 210, 212, and 209 are repeated until the one of the variables for the state S2 is stable. As still another example, when the frequency set point at the time before the operation 209 is performed is fs1−ss1, the processor 132 decreases the frequency set point fs1−ss1 by the pre-determined step size ss1 to generate a frequency set point fs1−ss1−ss1 for the pre-determined step time. The frequency set point fs1−ss1−ss1 is provided from the processor 132 to the DSP 110 via the cable 138. The DSP 110 sends the frequency set point fs1−ss1−ss1 to the auto-frequency tuner AFTS1. During the state S1, the auto-frequency tuner AFTS1 controls the driver system 120 and the RF power supply 112, in a manner described above, to generate the RF signal having the frequency set point fs1−ss1−ss1 at the output 116. The operations 206, 208, 210, 212, and 209 are repeated until the one of the variables for the state S2 is stable.

In an operation 214 of the method 200, it is determined whether the power set points Ps1 and Ps2 are met. For example, during the state S1, the sensor system 114 measures the supplied power of the RF signal generated and supplied by the RF generator 102, and provides the measurement of supplied power via the cable 136 to the processor 132. The processor 132 determines whether the measurement of supplied power for the state S1 is within a pre-stored power limit from the power set point Ps1. The pre-stored power limit is stored within the memory device 134. Upon determining that the measurement of supplied power for the state S1 is not within the pre-stored power limit, the processor 132 determines that the power set point Ps1 is not met and the operation 209 is performed by the processor 132. For example, during the state S1, when the frequency set point at the time before the operation 209 is performed is fs1, the processor 132 increases the frequency set point fs1 by the pre-determined step size ss1 to generate the frequency set point fs1+ss1 for the pre-determined step time. The frequency set point fs1+ss1 is provided from the processor 132 to the DSP 110 via the cable 138. The DSP 110 sends the frequency set point fs1+ss1 to the auto-frequency tuner AFTS1. During the state S1, the auto-frequency tuner AFTS1 controls the driver system 120 and the RF power supply 112, in a manner described above, to generate the RF signal having the frequency set point fs1+ss1 at the output 116. The operations 214, 209, 206, 208, 210, 212, and 214 are repeated until the measurement of supplied power from the sensor system 114 is within the pre-stored power limit for the state S1. The pre-stored power limit is stored within the memory device 134. Upon determining that the measurement of supplied power for the state S1 is not within the pre-stored power limit, the operation 209 is performed. As another example, when the frequency set point at the time before the operation 209 is performed is fs1, the processor 132 decreases the frequency set point fs1 by the pre-determined step size ss1 to generate the frequency set point fs1−ss1 for the pre-determined step time. The frequency set point fs1−ss1 is provided from the processor 132 to the DSP 110 via the cable 138. The DSP 110 sends the frequency set point fs1−ss1 to the auto-frequency tuner AFTS1. During the state S1, the auto-frequency tuner AFTS1 controls the driver system 120 and the RF power supply 112, in a manner described above, to generate the RF signal having the frequency set point fs1−ss1 at the output 116. The operations 209, 206, 208, 210, 212, and 214 are repeated until the measurement of supplied power from the sensor system 114 is within the pre-stored power limit for the state S1.

As yet another example, when the frequency set point at the time before the operation 209 is performed is fs1+ss1, the processor 132 increases the frequency set point fs1+ss1 by the pre-determined step size ss1 to generate the frequency set point fs1+ss1+ss1 for the pre-determined step time. The frequency set point fs1+ss1+ss1 is provided from the processor 132 to the DSP 110 via the cable 138. The DSP 110 sends the frequency set point fs1+ss1+ss1 to the auto-frequency tuner AFTS1. During the state S1, the auto-frequency tuner AFTS1 controls the driver system 120 and the RF power supply 112, in a manner described above, to generate the RF signal having the frequency set point fs1+ss1+ss1 at the output 116. The operations 209, 206, 208, 210, 212, and 214 are repeated until the measurement of supplied power from the sensor system 114 is within the pre-stored power limit for the state S1. As still another example, when the frequency set point at the time before the operation 209 is performed is fs1−ss1, the processor 132 decreases the frequency set point fs1−ss1 by the pre-determined step size ss1 to generate the frequency set point fs1−ss1−ss1 for the pre-determined step time. The frequency set point fs1−ss1−ss1 is provided from the processor 132 to the DSP 110 via the cable 138. The DSP 110 sends the frequency set point fs1−ss1−ss1 to the auto-frequency tuner AFTS1. During the state S1, the auto-frequency tuner AFTS1 controls the driver system 120 and the RF power supply 112, in a manner described above, to generate the RF signal having the frequency set point fs1−ss1−ss1 at the output 116. The operations 209, 206, 208, 210, 212, and 214 are repeated until the measurement of supplied power from the sensor system 114 is within the pre-stored power limit for the state S1.

As another example, during the state S2, the sensor system 114 measures the supplied power of the RF signal generated and supplied by the RF generator 102, and provides the measurement of supplied power via the cable 136 to the processor 132. The processor 132 determines whether the measurement of supplied power for the state S2 is within a pre-set power limit of the power set point Ps2. The pre-set power limit is stored within the memory device 134. In some embodiments, the pre-set power limit for the state S2 is the same or different from the pre-stored power limit for the state S1.

Upon determining that the measurement of supplied power for the state S2 is not within the pre-set power limit for power for the state S2, the processor 132 determines that the power set point Ps2 is not met and the operation 209 is performed by the processor 132. For example, when the frequency set point at the time before the operation 209 is performed is fs1, during the state S1, the processor 132 increases the frequency set point fs1 by the pre-determined step size ss1 to generate the frequency set point fs1+ss1 for the pre-determined step time. The frequency set point fs1+ss1 is provided from the processor 132 to the DSP 110 via the cable 138. The DSP 110 sends the frequency set point fs1+ss1 to the auto-frequency tuner AFTS1. During the state S1, the auto-frequency tuner AFTS1 controls the driver system 120 and the RF power supply 112, in a manner described above, to generate the RF signal having the frequency set point fs1+ss1 at the output 116. The operations 209, 206, 208, 210, 212, and 214 are repeated until the measurement of supplied power from the sensor system 114 is within the pre-set power limit for the state S2. As another example, when the frequency set point at the time before the operation 209 is performed is fs1, the processor 132 decreases the frequency set point fs1 by the pre-determined step size ss1 to generate the frequency set point fs1−ss1 for the pre-determined step time. The frequency set point fs1−ss1 is provided from the processor 132 to the DSP 110 via the cable 138. The DSP 110 sends the frequency set point fs1−ss1 to the auto-frequency tuner AFTS1. During the state S1, the auto-frequency tuner AFTS1 controls the driver system 120 and the RF power supply 112, in a manner described above, to generate the RF signal having the frequency set point fs1−ss1 at the output 116. The operations 209, 206, 208, 210, 212, and 214 are repeated until the measurement of supplied power from the sensor system 114 is within the pre-set power limit for the state S2.

As another example, during the state S1, when the frequency set point at the time before the operation 209 is performed is fs1+ss1, the processor 132 increases the frequency set point fs1+ss1 by the pre-determined step size ss1 to generate the frequency set point fs1+ss1+ss1 for the pre-determined step time. The frequency set point fs1+ss1+ss1 is provided from the processor 132 to the DSP 110 via the cable 138. The DSP 110 sends the frequency set point fs1+ss1+ss1 to the auto-frequency tuner AFTS1. During the state S1, the auto-frequency tuner AFTS1 controls the driver system 120 and the RF power supply 112, in a manner described above, to generate the RF signal having the frequency set point fs1+ss1+ss1 at the output 116. The operations 209, 206, 208, 210, 212, and 214 are repeated until the measurement of supplied power from the sensor system 114 is within the pre-set power limit for the state S2. As still another example, when the frequency set point at the time before the operation 209 is performed is fs1−ss1, the processor 132 decreases the frequency set point fs1−ss1 by the pre-determined step size ss1 to generate the frequency set point fs1−ss1−ss1 for the pre-determined step time. The frequency set point fs1−ss1−ss1 is provided from the processor 132 to the DSP 110 via the cable 138. The DSP 110 sends the frequency set point fs1−ss1−ss1 to the auto-frequency tuner AFTS1. During the state S1, the auto-frequency tuner AFTS1 controls the driver system 120 and the RF power supply 112, in a manner described above, to generate the RF signal having the frequency set point fs1−ss1−ss1 at the output 116. The operations 209, 206, 208, 210, 212, and 214 are repeated until the measurement of supplied power from the sensor system 114 is within the pre-set power limit for the state S2. The method 200 ends when the measurement of supplied power for the state S1 is within the pre-stored power limit for the state S1 and the measurement of supplied power for the state S2 is within the pre-set power limit for the state S2.

Figure 3:
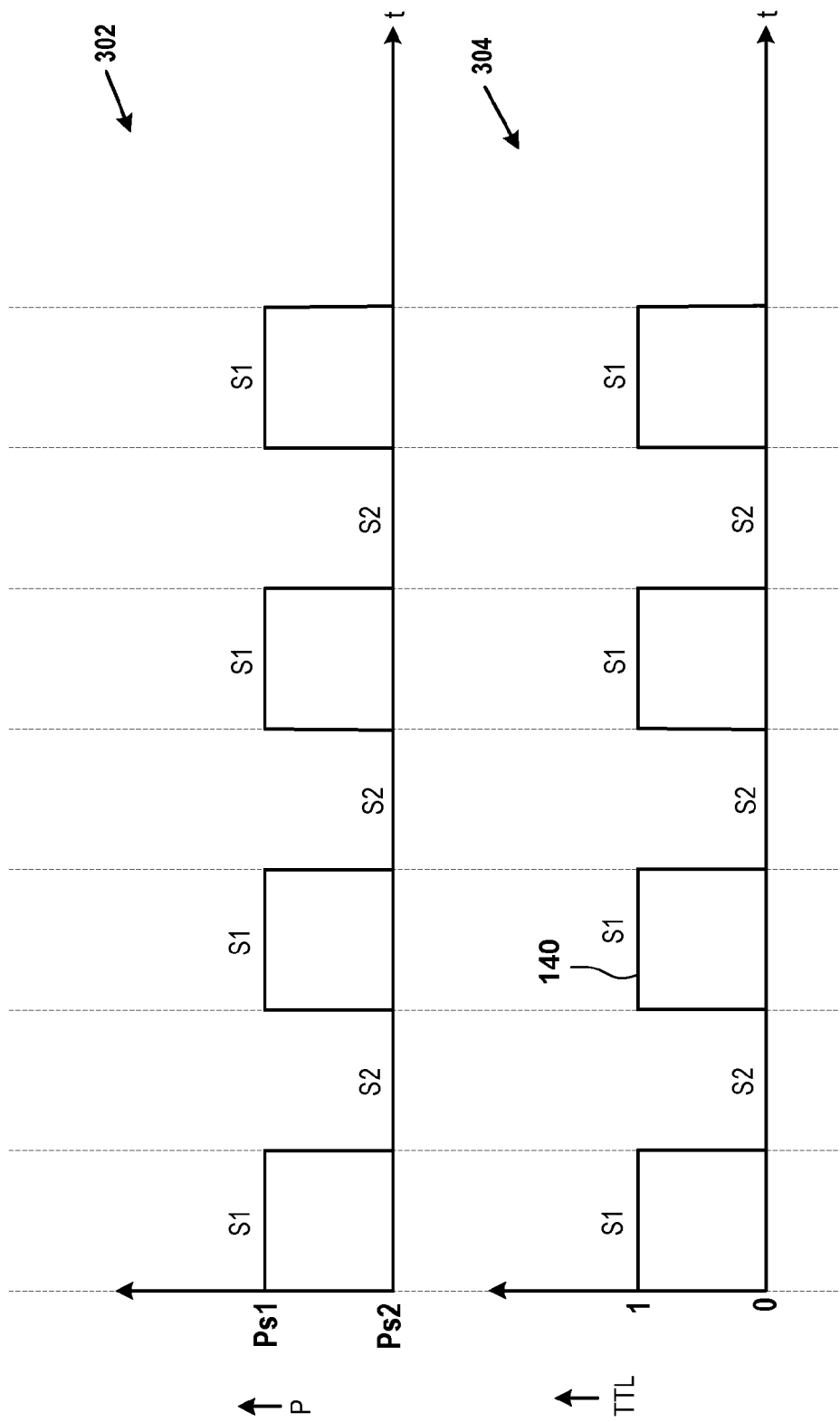
FIG. 3 is a diagram of an embodiment of a graph to illustrate the two states S1 and S2 of a radio frequency (RF) signal that is generated by an RF generator and a graph to illustrate the two states S1 and S2 of a pulsed signal.

FIG. 3 is a diagram of an embodiment of a graph 302 to illustrate the two states S1 and S2 of the RF signal that is generated by the RF generator 102 (FIG. 1) and a graph 304 to illustrate the two states S1 and S2 of pulsed signal 140. The graph 302 plots supplied power at the output 116 versus time and the graph 304 also plots a logic level, such as 0 or 1, of the pulsed signal 140. The RF signal that is generated by the RF generator 102 alternates between the two states S1 and S2 by alternating between the two power set points Ps1 and Ps2. An example of a power set point for a state is a root mean square (RMS) value of power amounts for the state. Another example of a power set point for a state is a zero-to-peak value of power amounts for the state. It should be noted that the power set point Ps2 is zero or an amount greater than zero but less than the power set point Ps1. The pulsed signal 140 alternates between the logic levels 1 and 0. The logic level 1 occurs during the state S1 of the pulsed signal 140 and the logic level 0 occurs during the state S2 of the pulsed signal 140.

The power set points of the RF signal that is generated by the RF generator 102 are synchronized to the logic levels 1 and 0 of the pulsed signal 140. For example, at a time of transition of from the logic level 0 to the logic level 1, the RF signal that is generated by the RF generator 102 transitions from the power set point Ps2 to the power set point Ps1. As another example, at a time of transition of from the logic level 1 to the logic level 0, the RF signal that is generated by the RF generator 102 transitions from the power set point Ps1 to the power set point Ps2.

Figure 4:
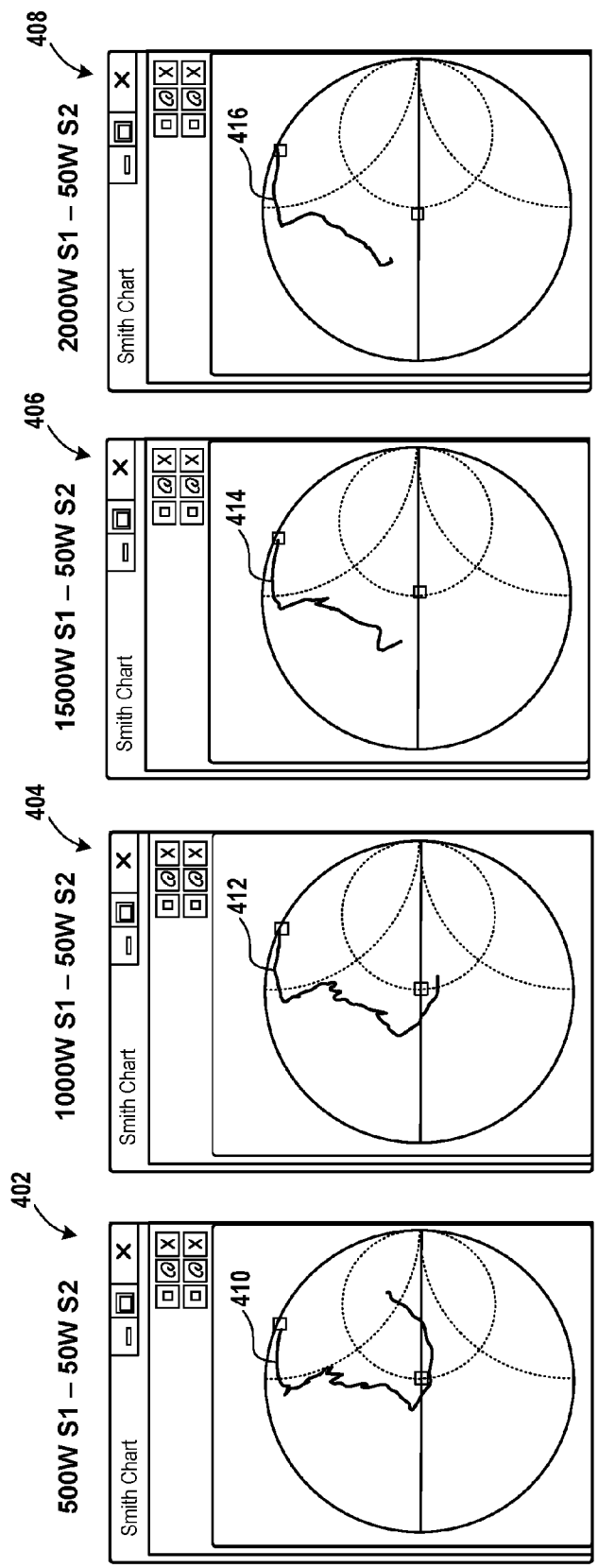
FIG. 4 is a diagram of embodiments of multiple Smith charts to illustrate that with an increase in power difference between power set points for the states S1 and S2, there is a decrease in a tunable frequency range for the state S2.

FIG. 4 is a diagram of embodiments of multiple Smith charts 402, 404, 406, and 408 to illustrate that with an increase in power difference between the power set points Ps1 and Ps2, there is a decrease in a tunable frequency range for the state S2. Each Smith chart plots an impedance or an admittance. For example, a resistance of the impedance is plotted on an x-axis and a reactance of the impedance is plotted on a y-axis. A power difference between the power set points Ps1 and Ps2, e.g., between 1000 watts and 50 watts, etc., in the Smith chart 404 is greater than a power difference between the power set points Ps1 and Ps2, e.g., between 500 watts and 50 watts, etc., in the Smith chart 402. Similarly, a power difference, e.g., between 1500 watts and 50 watts, etc., between the power set points Ps1 and Ps2 in the Smith chart 406 is greater than a power difference between the power set points Ps1 and Ps2, e.g., between 1000 watts and 50 watts, etc., in the Smith chart 404. Similarly, a power difference, e.g., between 2000 watts and 50 watts, etc., between the power set points Ps1 and Ps2 in the Smith chart 408 is greater than a power difference between the power set points Ps1 and Ps2, e.g., between 1500 watts and 50 watts, etc., in the Smith chart 406. With an increase in the power difference between the power set points Ps1 and Ps2, a range of the tunable frequency for the state S2 to achieve an impedance close to or of 50 ohms at the output 116 (FIG. 1) decreases as represented by plots 410, 412, 414, and 416.

The methods and systems described herein disclose that the one or more variables determined in the states S1 and S2 are used to tune the frequency in the state S1. By considering the one or more variables in both the states S1 and S2, the frequency in the state S1 is tuned to achieve an impedance close to or of 50 ohms at the output 116 (FIG. 1) to further reduce power that is reflected towards the RF generator 102.

Figure 5:
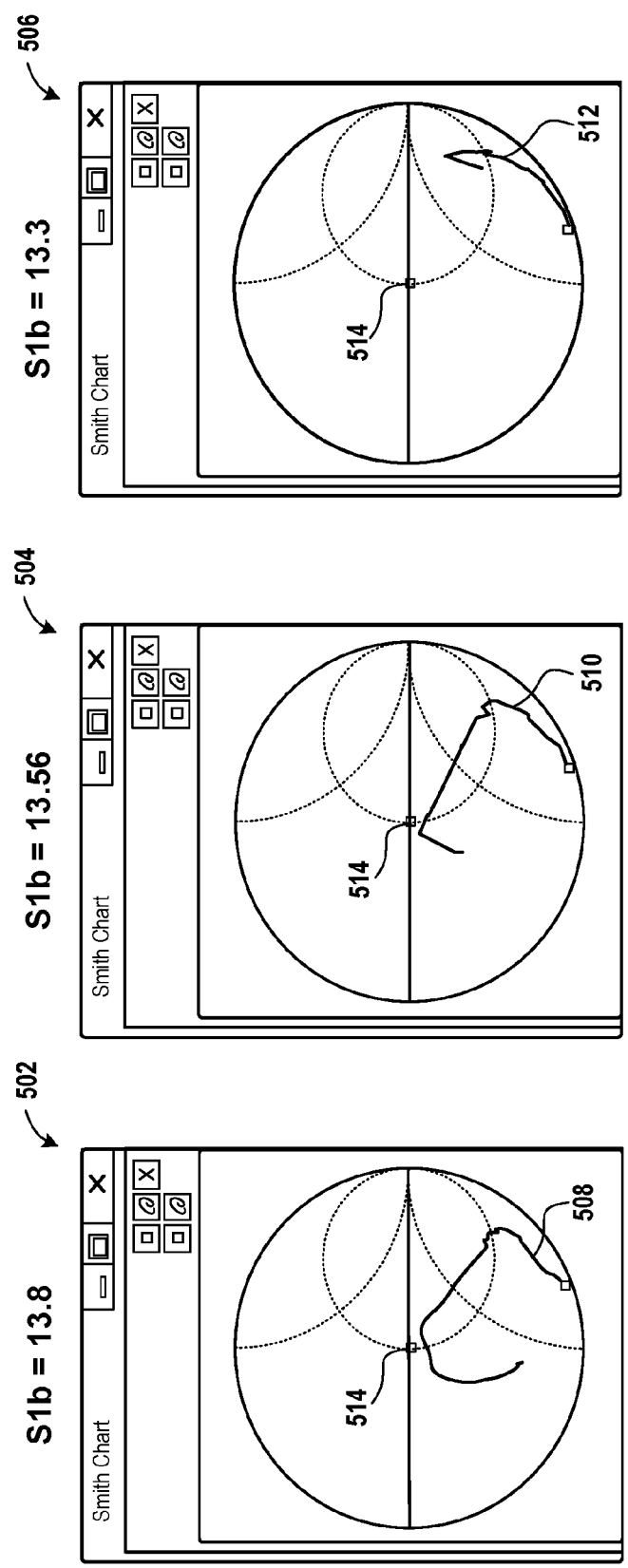
FIG. 5 is a diagram of embodiments of multiple Smith charts to illustrate that a change in a frequency set point for the state S1 helps achieve a desirable plasma impedance at an output of the RF generator.

FIG. 5 is a diagram of embodiments of multiple Smith charts 502, 504, and 506 to illustrate that a change in the frequency set point for the state S1 helps achieve a desirable plasma impedance at the output 116. The Smith chart 502 plots an impedance 508, the Smith chart 504 plots an impedance 510, and the Smith chart 506 plots an impedance 512. The desirable plasma impedance is achieved at a point 514 on the Smith charts 502, 504, and 506. Again, by considering the one or more variables for the states S1 and S2 in tuning the frequency for the state S1, the desirable plasma impedance at the point 514 is achieved.

Figure 6A:
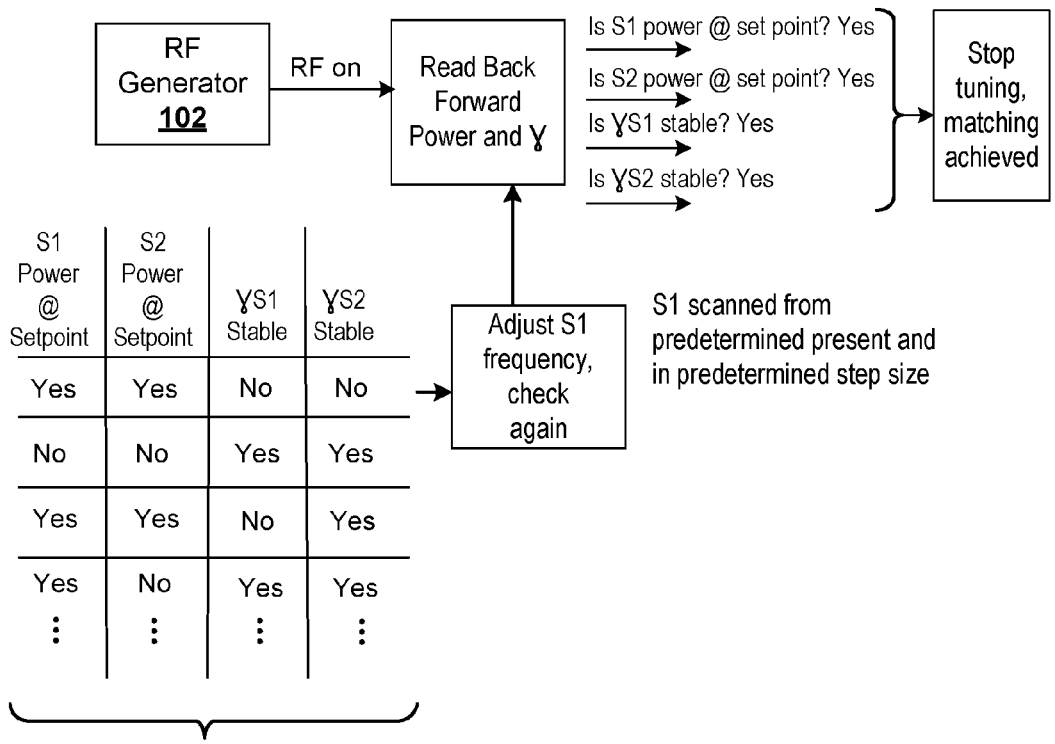
FIG. 6A is a diagram of an embodiment of a method for tuning the frequency set point for the state S1 based on the one or more variables for the state S1 and the one or more variables for the state S2.

FIG. 6A is a diagram of an embodiment of a method 600 for tuning the frequency set points fs1 and fs2 based on the one or more variables for the state S1 and the one or more variables for the state S2.

Figure 6B:
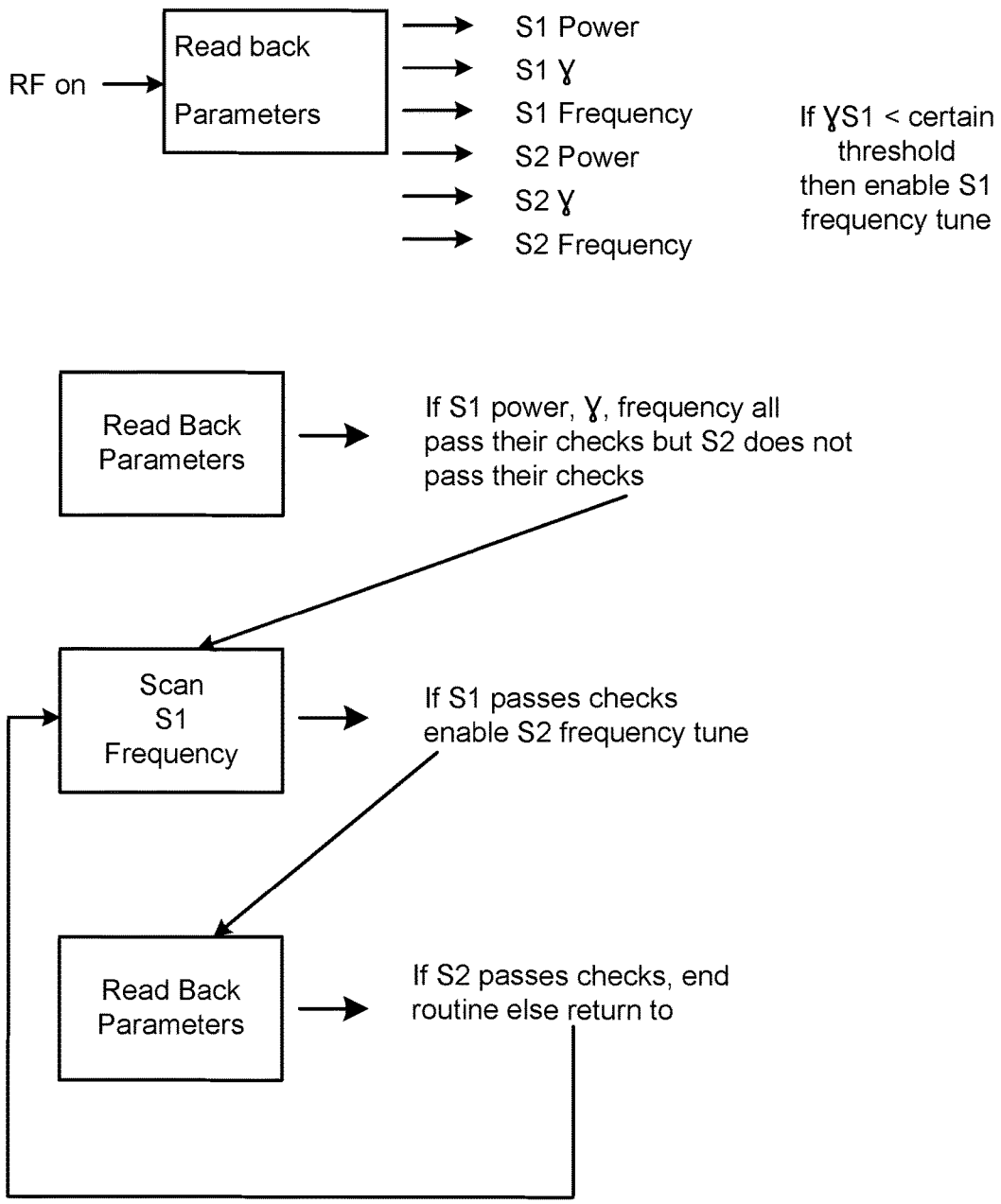
FIG. 6B is a diagram of an embodiment of a method for tuning the frequency set point for the state S1 based on the one or more variables for the state S1 and the one or more variables for the state S2.

FIG. 6B is a diagram of an embodiment of a method 650 for tuning the frequency set points fs1 and fs2 based on the one or more variables for the state S1 and the one or more variables for the state S2.

It should be noted that the embodiments described herein are described using two states. In some embodiments, three or more than three states may be used.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for achieving reduction in power reflected towards a radio frequency (RF) generator, comprising:
providing a plurality of set points to the RF generator, wherein the set points include a frequency set point for a first state of a digital pulsed signal, a frequency set point for a second state of the digital pulsed signal, a power set point for the first state of the digital pulsed signal, and a power set point for the second state of the digital pulsed signal;
adjusting an impedance matching circuit to reduce a variable for the first state to be below a pre-determined variable threshold, wherein the variable is associated with the RF generator;
determining whether the variable for the first state is stable;
adjusting the frequency set point for the second state upon determining that the variable for the first state is stable, wherein said adjusting the frequency set point for the second state is performed to reduce a variable for the second state to be lower than a pre-set variable threshold;
determining whether the variable for the second state is stable; and
changing the frequency set point for the first state in response to determining that the variable for the second state is not stable to achieve the reduction in power reflected towards the RF generator.

2. The method of claim 1, further comprising changing the frequency set point for the first state in response to determining that the variable for the first state is not stable.

3. The method of claim 1, further comprising:
determining whether the power set point for the first state is achieved; and
changing the frequency set point for the first state upon determining that the power set point for the first state is not achieved.

4. The method of claim 1, further comprising:
determining whether the power set point for the second state is achieved; and
changing the frequency set point for the first state upon determining that the power set point for the second state is not achieved.

5. The method of claim 1, wherein the variable associated with the RF generator is measured at an output of the RF generator.

6. The method of claim 1, wherein the variable for the first state includes a magnitude of a voltage reflection coefficient, wherein said determining whether the variable for the first state is stable includes determining whether the magnitude of the voltage reflection coefficient measured during the first state is stable.

7. The method of claim 1, wherein the variable for the second state includes a magnitude of a voltage reflection coefficient, wherein said determining whether the variable for the second state is stable includes determining whether the magnitude of the voltage reflection coefficient measured during the second state is stable.

8. The method of claim 1, wherein the frequency set point for the first state is a value of frequency of an RF signal to be supplied by the RF generator during the first state, wherein the frequency set point for the second state is a value of frequency of the RF signal to be supplied by the RF generator during the second state, wherein the power set point for the first state is a value of power of the RF signal to be supplied by the RF generator during the first state, wherein the power set point for the second state is a value of power of the RF signal to be supplied by the RF generator during the second state.

9. A system for achieving reduction in power reflected towards a radio frequency (RF) generator, comprising:
  an RF generator configured to generate an RF signal;
  an impedance matching network coupled to the RF generator for receiving the RF signal to generate a modified RF signal;
  a plasma chamber coupled to the impedance matching network for receiving the modified RF signal;
  a host computer system coupled to the RF generator, wherein the host computer system includes a processor configured to:
    provide a plurality of set points to the RF generator, wherein the set points include a frequency set point for a first state of a digital pulsed signal, a frequency set point for a second state of the digital pulsed signal, a power set point for the first state of the digital pulsed signal, and a power set point for the second state of the digital pulsed signal;
    adjust the impedance matching network to reduce a variable for the first state to be below a pre-determined variable threshold, wherein the variable for the first state is associated with the RF generator;
    determine whether the variable for the first state is stable;
    adjust the frequency set point for the second state upon determining that the variable for the first state is stable, wherein the frequency set point for the second state is adjusted to reduce a variable for the second state to be lower than a pre-set variable threshold;
    determine whether the variable for the second state is stable; and
    change the frequency set point for the first state in response to determining that the variable for the second state is not stable to achieve the reduction in power reflected towards the RF generator.

10. The system of claim 9, wherein the processor is further configured to change the frequency set point for the first state in response to determining that the variable for the first state is not stable.

11. The system of claim 9, wherein the processor is further configured to:
  determine whether the power set point for the first state is achieved; and
  change the frequency set point for the first state upon determining that the power set point for the first state is not achieved.

12. The system of claim 9, wherein the processor is further configured to:
  determine whether the power set point for the second state is achieved; and
  change the frequency set point for the first state upon determining that the power set point for the second state is not achieved.

13. The system of claim 9, wherein the variable associated with the RF generator is measured at an output of the RF generator.

14. The system of claim 9, wherein the variable for the first state includes a magnitude of a voltage reflection coefficient, wherein to determine whether the variable for the first state is stable, the processor is configured to determine whether the magnitude of the voltage reflection coefficient measured during the first state is stable.

15. The system of claim 9, wherein the variable for the second state includes a magnitude of a voltage reflection coefficient, wherein to determine whether the variable for the second state is stable, the processor is configured to determine whether the magnitude of the voltage reflection coefficient measured during the second state is stable.

16. The system of claim 9, wherein the frequency set point for the first state is a value of frequency of the RF signal to be supplied by the RF generator during the first state, wherein the frequency set point for the second state is a value of frequency of the RF signal to be supplied by the RF generator during the second state, wherein the power set point for the first state is a value of power of the RF signal to be supplied by the RF generator during the first state, wherein the power set point for the second state is a value of power of the RF signal to be supplied by the RF generator during the second state.

17. A non-transitory computer readable medium storing a program causing a computer to execute a plurality of operations for achieving a reduction in power reflected towards a radio frequency (RF) generator, the operations comprising:
  providing a plurality of set points to the RF generator, wherein the set points include a frequency set point for a first state of a digital pulsed signal, a frequency set point for a second state of the digital pulsed signal, a power set point for the first state of the digital pulsed signal, and a power set point for the second state of the digital pulsed signal;
  adjusting an impedance matching circuit to reduce a variable for the first state to be below a pre-determined variable threshold, wherein the variable is associated with the RF generator;
  determining whether the variable for the first state is stable;
  adjusting the frequency set point for the second state upon determining that the variable for the first state is stable, wherein said adjusting the frequency set point for the second state is performed to reduce a variable for the second state to be lower than a pre-set variable threshold;
  determining whether the variable for the second state is stable; and
  changing the frequency set point for the first state in response to determining that the variable for the second state is not stable to achieve the reduction in power reflected towards the RF generator.

18. The non-transitory computer readable medium of claim 17, wherein the operations further comprise changing the frequency set point for the first state in response to determining that the variable for the first state is not stable.

19. The non-transitory computer readable medium of claim 17, wherein the operations further comprise:
  determining whether the power set point for the first state is achieved; and
  changing the frequency set point for the first state upon determining that the power set point for the first state is not achieved.

20. The non-transitory computer readable medium of claim 17, wherein the operations further comprise:
  determining whether the power set point for the second state is achieved; and changing the frequency set point for the first state upon determining that the power set point for the second state is not achieved.

21. The non-transitory computer readable medium of claim 17, wherein the variable associated with the RF generator is measured at an output of the RF generator.

22. The non-transitory computer readable medium of claim 17, wherein the variable for the first state includes a magnitude of a voltage reflection coefficient, wherein the operation of determining whether the variable for the first state is stable includes determining whether the magnitude of the voltage reflection coefficient measured during the first state is stable.

23. The non-transitory computer readable medium of claim 17, wherein the variable for the second state includes a magnitude of a voltage reflection coefficient, wherein the operation of determining whether the variable for the second state is stable includes determining whether the magnitude of the voltage reflection coefficient measured during the second state is stable.

24. The non-transitory computer readable medium of claim 17, wherein the frequency set point for the first state is a value of frequency of an RF signal to be supplied by the RF generator during the first state, wherein the frequency set point for the second state is a value of frequency of the RF signal to be supplied by the RF generator during the second state, wherein the power set point for the first state is a value of power of the RF signal to be supplied by the RF generator during the first state, wherein the power set point for the second state is a value of power of the RF signal to be supplied by the RF generator during the second state.

* * * * *